United States Patent
Lee (10) Patent No.: US 10,551,268 B2
(45) Date of Patent: Feb. 4, 2020

(54) PRESSURE SENSOR WITH LENGTHILY DISPOSED SUBSTRATE

(71) Applicant: MANDO CORPORATION, Pyeongtaek-si, Gyeonggi-do (KR)

(72) Inventor: GonJae Lee, Yongin-si (KR)

(73) Assignee: MANDO CORPORATION, Pyeongtaek-si, Gyeonggi-Do (KR)

( * ) Notice: Subject to any disclaimer, the term of this patent is extended or adjusted under 35 U.S.C. 154(b) by 126 days.

(21) Appl. No.: 15/793,179

(22) Filed: Oct. 25, 2017

(65) Prior Publication Data

US 2018/0113044 A1   Apr. 26, 2018

(30) Foreign Application Priority Data

Oct. 26, 2016   (KR) .................. 10-2016-0139881

(51) Int. Cl.
*G01L 19/06*   (2006.01)
*G01L 5/00*   (2006.01)
(Continued)

(52) U.S. Cl.
CPC ........ *G01L 19/0627* (2013.01); *G01L 5/0085* (2013.01); *G01L 19/0084* (2013.01);
(Continued)

(58) Field of Classification Search
CPC ... G01L 19/147; G01L 9/0042; G01L 9/0072; G01L 13/025; G01L 19/04; G01L 9/0054; G01L 9/0075; G01L 19/0038; G01L 19/0084; G01L 19/14; G01L 19/069; G01L 19/0618; G01L 19/0645; G01L 9/0055; G01L 9/0073; G01L 19/0092; G01L 19/143; G01L 9/0051; G01L 9/0052; G01L 11/025; G01L 19/0007; G01L 19/0046; G01L 19/06; G01L 19/0627; G01L 19/0681; G01L 9/00; G01L 9/0041; G01L 9/0044; G01L 11/04; G01L 19/0023; G01L 19/0672; G01L 19/069; G01L 19/142; G01L 19/16; G01L 27/002;
(Continued)

(56) References Cited

U.S. PATENT DOCUMENTS

2016/0123827 A1* 5/2016 Lee ..................... G01L 19/147
73/723

FOREIGN PATENT DOCUMENTS

| CN | 1699945 A | 11/2005 |
|---|---|---|
| CN | 104204732 A | 12/2014 |
| CN | 105571771 A | 5/2016 |

OTHER PUBLICATIONS

Chinese Office Action dated Jul. 3, 2019 in connection with counterpart Chinese Patent Application No. 201711018715.X.

* cited by examiner

*Primary Examiner* — Andre J Allen
(74) *Attorney, Agent, or Firm* — Hauptman Ham, LLP (57) ABSTRACT

The embodiments relate to a pressure sensor comprising: a sensor module which is sensing pressure; a first supporter coupled to an upper portion of the sensor module, having a substrate 231, lengthily disposed therein in an axial direction, and thus electrically connected to the sensor module; and a second supporter to which the substrate is couple while brought into contact with a spring electrode, the second supporter being coupled to an upper portion of the first supporter and having a spring groove in which a lower end portion of spring electrode lengthily disposed in an axial direction is stably placed.

15 Claims, 8 Drawing Sheets

(51) Int. Cl.
*G01L 19/00* (2006.01)
*G01L 19/14* (2006.01)

(52) U.S. Cl.
CPC .. *G01L 19/147* (2013.01); *H01L 2224/48091* (2013.01); *H01L 2224/48137* (2013.01); *H01L 2224/73265* (2013.01)

(58) Field of Classification Search
CPC . G01L 7/00; G01L 7/163; G01L 7/166; G01L 9/0047; G01L 11/02; G01L 13/00; G01L 15/00; G01L 19/003; G01L 19/0609; G01L 19/083; G01L 19/10; G01L 19/148; G01L 7/08; G01L 7/082; G01L 9/0045; G01L 9/0048; G01L 9/006; G01L 9/007; G01L 9/0076; G01L 9/045; G01L 9/06; G01L 9/065; G01L 9/12; G01L 9/125; G01L 11/00; G01L 17/00; G01L 19/00; G01L 19/0015; G01L 19/0076; G01L 19/02; G01L 19/08; G01L 19/141; G01L 19/145; G01L 19/146; G01L 1/142; G01L 1/2262; G01L 1/246; G01L 21/12; G01L 23/16; G01L 27/005; G01L 27/007; G01L 7/04; G01L 7/063; G01L 7/084; G01L 7/086; G01L 7/16; G01L 9/0002; G01L 9/0007; G01L 9/0016; G01L 9/0019; G01L 9/0022; G01L 9/0027; G01L 9/0033; G01L 9/0039; G01L 9/005; G01L 9/0058; G01L 9/0077; G01L 9/0079; G01L 9/008; G01L 9/0092; G01L 9/0095; G01L 9/025; G01L 9/04; G01L 9/08; G01L 9/085; G01L 9/105; G01L 9/14; G01L 9/16
USPC .................................................. 73/700–756
See application file for complete search history.

PRESSURE SENSOR WITH LENGTHILY DISPOSED SUBSTRATE

CROSS REFERENCE TO RELATED APPLICATION

This application claims priority from Korean Patent Application No. 10-2016-0139881, filed on Oct. 26, 2016, which is hereby incorporated by reference for all purposes as if fully set forth herein.

BACKGROUND OF THE INVENTION

1. Field of the Invention

The present embodiments relate to a pressure sensor and, more particularly, to a pressure sensor which: includes a substrate in an axial direction to allow the pressure sensor to be manufactured in a compact size by reducing the size of the substrate; includes only one substrate which is directly connected to a connector of a terminal portion via an electric wire to reduce material and process costs for forming the electrical connection; is stable in the electrical connection due to the substrate coming into contact with the outer circumferential surface of a spring electrode; and includes an additional electrode member so that the substrate and the spring electrode are connected in a double contact structure, thereby preventing contact failure and malfunction.

2. Description of the Prior Art

Generally, a pressure sensor is mounted on an object to be measured and transmits a measured value to an electronic control device through a separate connector or a cable. The electronic control device, for example, controls a brake operating.

However, a pressure sensor according to the related art has a substrate disposed in a horizontal direction, and thus the size of the substrate is required to be reduced in order to miniaturize the pressure sensor. Therefore, there is a limit in miniaturizing the pressure sensor and it is difficult to install the pressure in various places due to the large overall size thereof.

In addition, conventionally, the pressure sensor separately includes an electronic equipment module, a contact substrate, and a spring electrically connecting the electronic equipment module and the contact substrate thus material and process costs for the electrical connection are increased, thereby resulting in reduced cost competitiveness.

SUMMARY OF THE INVENTION

The present embodiments have been devised from the background as described above and an aspect of the present embodiments is to provide a pressure sensor, which includes a substrate in an axial direction to allow the pressure sensor to be manufactured in a compact size by reducing the size of the substrate, and includes only one substrate which is connected to a connector of a terminal portion via an electric wire to reduce material and process costs for forming the electrical connection.

In addition, another aspect of the present disclosure is to provide a pressure sensor which is stable in the electrical connection due to a substrate coming into contact with the outer circumferential surface of a spring electrode and includes an additional electrode member so that the substrate and the spring electrode are connected in a double contact structure, thereby preventing contact failure and malfunction.

The aspect of the present disclosure is not limited thereto, and other unmentioned aspects of the present disclosure may be clearly appreciated by those skilled in the art from the following descriptions.

The present embodiments may provide a pressure sensor including: a sensor module which senses pressure; a first supporter, which is coupled to an upper portion of the sensor module and has a substrate disposed therein, the substrate being lengthily disposed in an axial direction to be electrically connected to the sensor module; and a second supporter to which the substrate is couple while being brought into contact with the spring electrode, the second supporter being coupled to an upper portion of the first supporter and having a spring groove formed therein in which lower end portion of the spring electrode lengthily formed in an axial direction is stably placed.

According to the present embodiments, the pressure sensor includes a substrate formed in an axial direction and thus can be manufactured in a compact size by reducing the size of the substrate. Further, the pressure sensor includes only one substrate which is directly connected to a connector of a terminal portion via an electric wire to reduce material and process costs for forming the electrical connection.

In addition, the electrical connection of the pressure sensor is stable due to the substrate which comes into contact with the outer circumferential surface of the spring electrode and includes an additional electrode member so that the substrate and the spring electrode are connected in a double contact structure, thereby preventing contact failure and malfunction.

DETAILED DESCRIPTION OF THE EXEMPLARY EMBODIMENTS

Hereinafter, embodiments of the present disclosure will be described in detail with reference to the accompanying drawings. In adding reference numerals to elements in each drawing, it should be noted that the same elements are designated by the same reference numerals, if possible, although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence and the like of a corresponding structural element are not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component.

Figure 1:
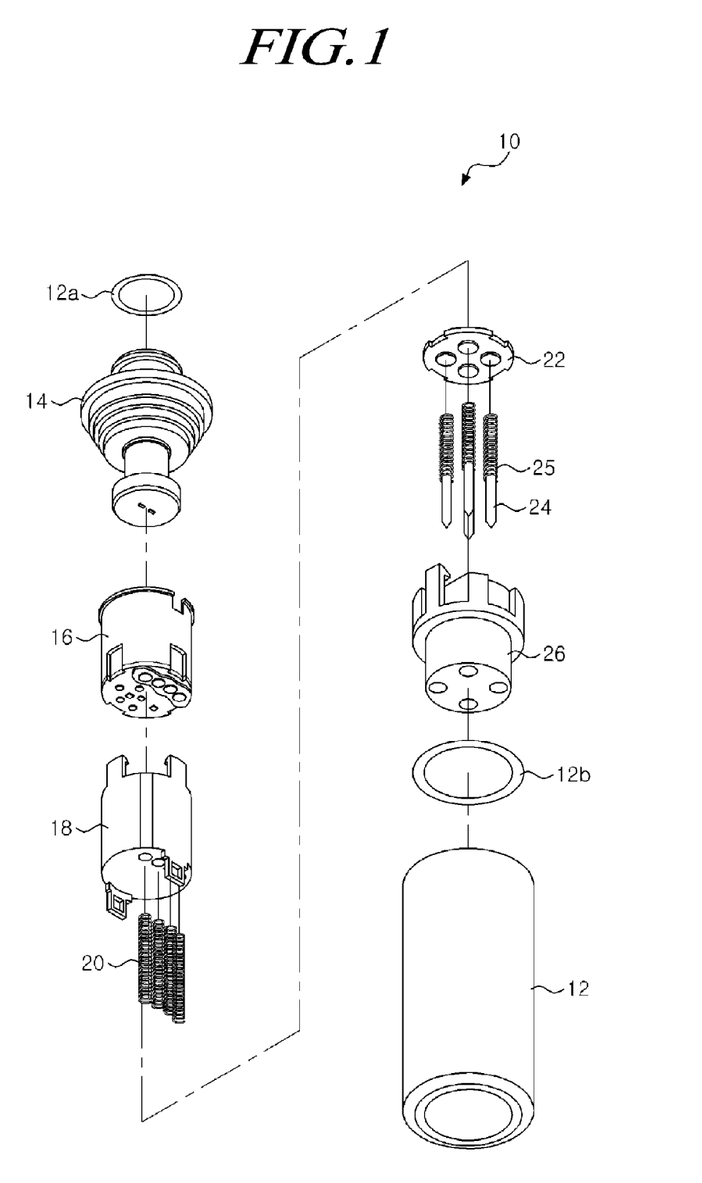
FIG. 1 is an exploded perspective view of a pressure sensor.

A pressure sensor 10 shown in FIG. 1 includes: pin member 24 which is brought into contact with an electronic control device; and a lower guide 26 which guides the movement of the pin member 24 and has a contact substrate 22 installed thereon.

Further, spring 25 is coupled to the pin member 24 to elastically support the pin member 24.

In addition, an upper guide 18 has the spring 20 installed therein that connect the pin member 24 and the contact substrate 22 and elastically presses the pin member 24 such that the pin member 24 is brought into tight contact with a circuit substrate.

In addition, the upper guide 18 is coupled to an upper portion of the contact substrate 22 and an electronic equipment module 16 having a pressure sensing unit and a controller of the pressure sensing unit therein is coupled to an upper portion of the upper guide 18.

Meanwhile, the spring 20 is installed in the upper guide 18 to electrically connect the contact substrate 22 and the electronic equipment module 16.

In addition, a sensor module 14 having various sensors mounted thereon is installed on the upper portion of the electronic equipment module 16.

Various components for the pressure sensor 10 are integrated by a housing 12, and O-rings 12a and 12b are installed on the upper and lower portions of the housing 12, respectively.

In the above-described pressure sensor 10, when a braking force is generated by a driver's pressing force applied to a petal, the pressure sensor 10 is moved by minute vibration.

At this time, the pressure sensor 10 is electrically connected to the circuit substrate by the pin member 24 which is elastically pressed by the spring 20.

Figure 2:
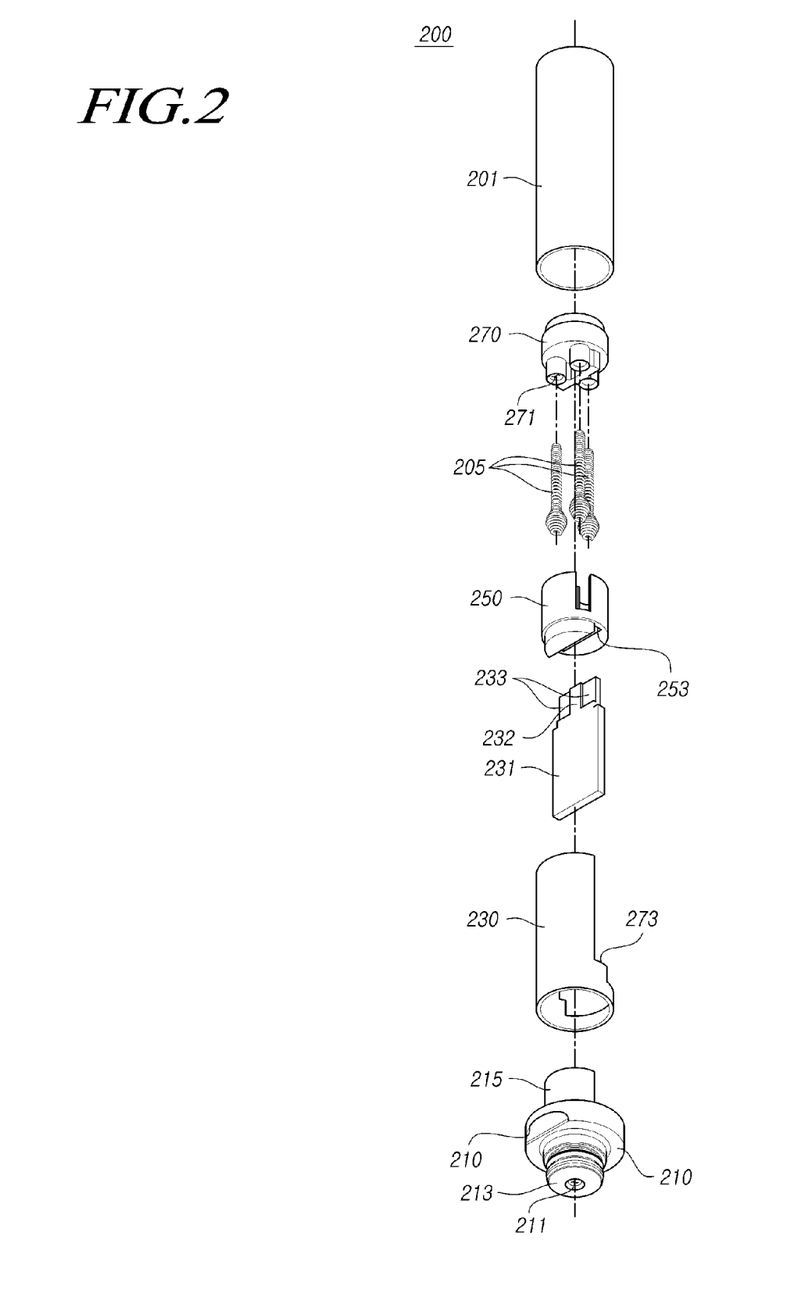
FIG. 2 is an exploded perspective view of a pressure sensor according to the present embodiments.
Figure 3:
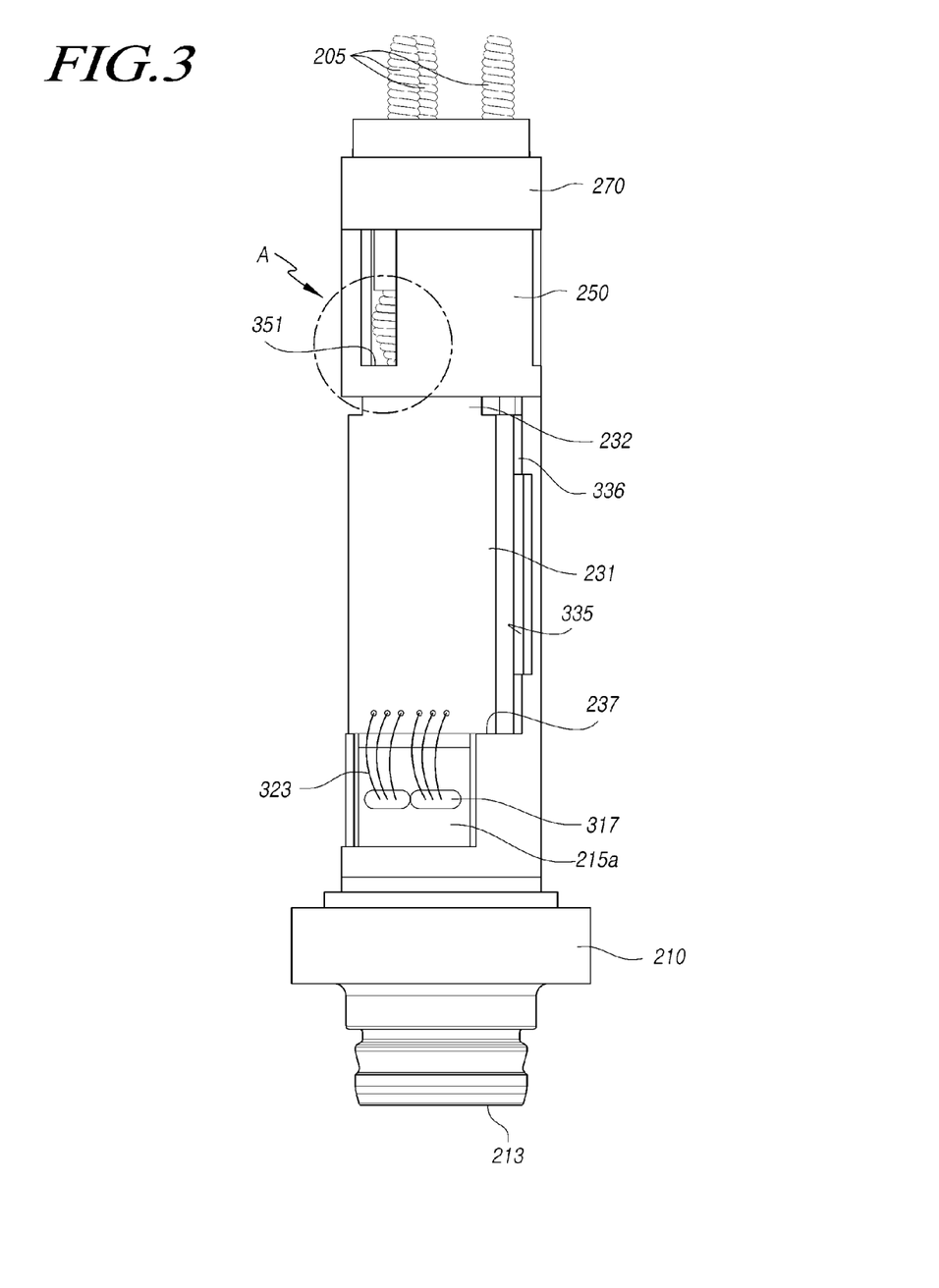
FIG. 3 is a perspective view of a part of a pressure sensor according to the present embodiments.
Figure 4:
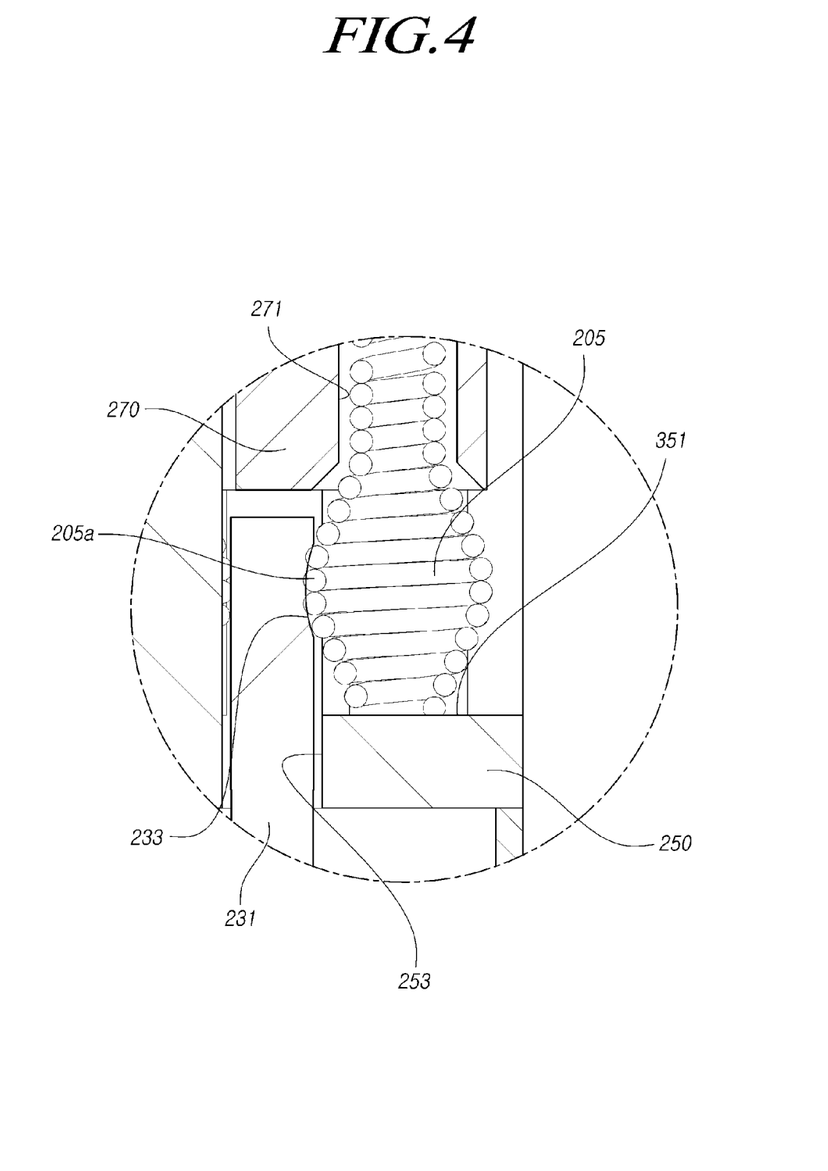
FIG. 4 is a longitudinal sectional view of A of FIG. 3.
Figure 5:
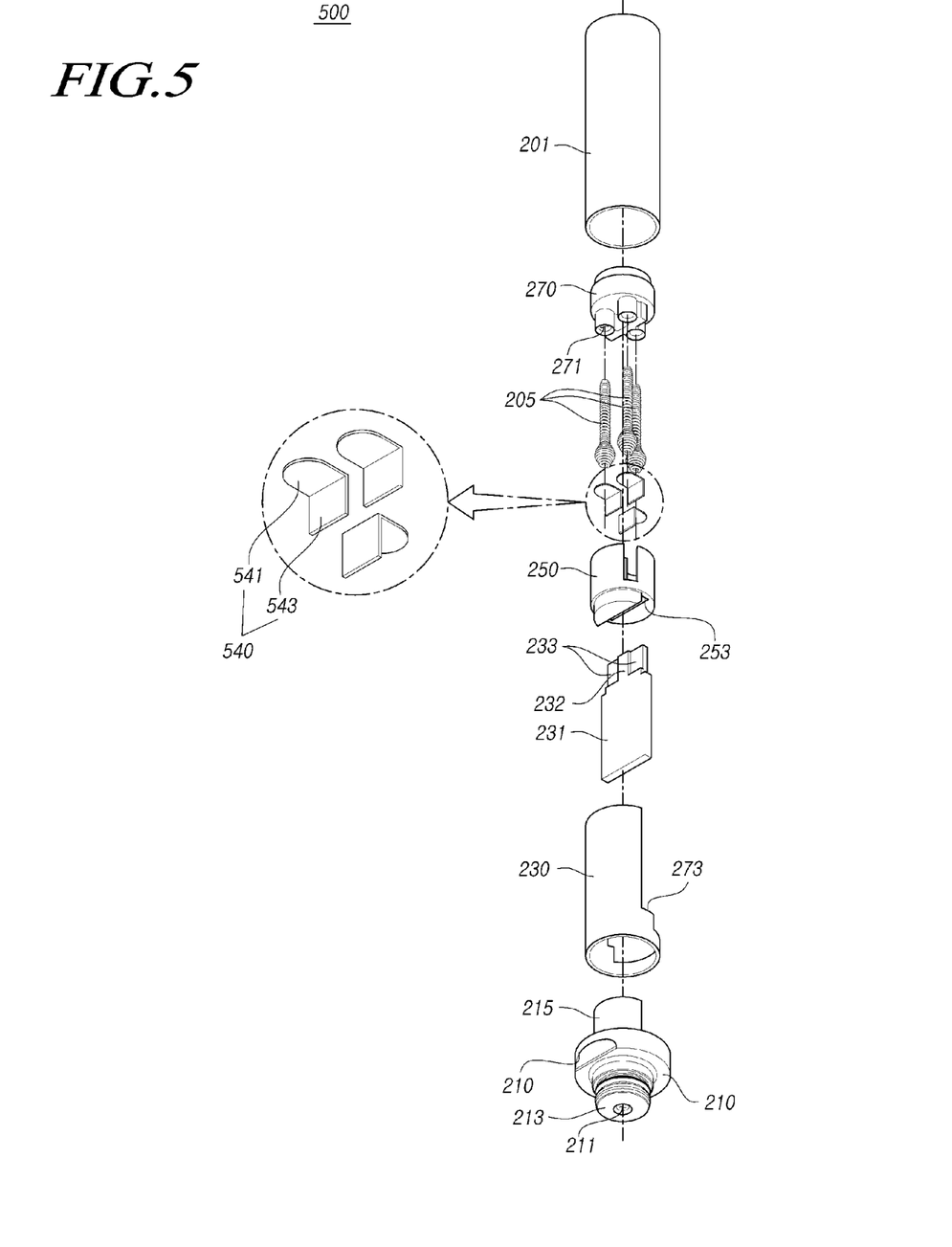
FIG. 5 is an exploded perspective view of a pressure sensor according to the present embodiments.
Figure 6:
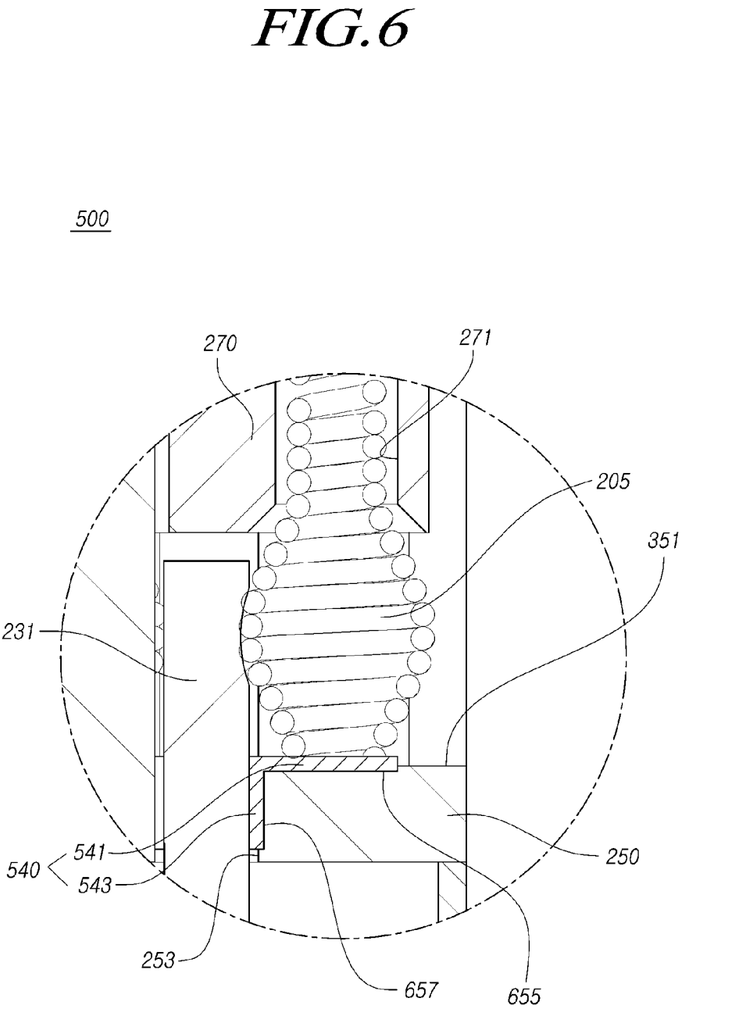
FIG. 6 is a sectional view of a part of a pressure sensor according to the present embodiments.
Figure 7:
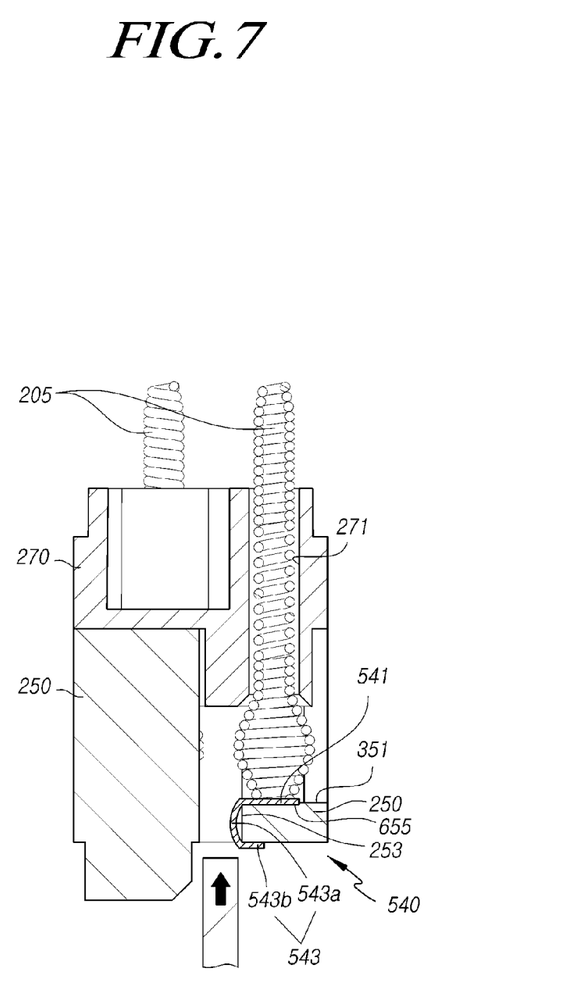
FIG. 7 and FIG. 8 are sectional view of a pressure sensor according to the present embodiments.
Figure 8:
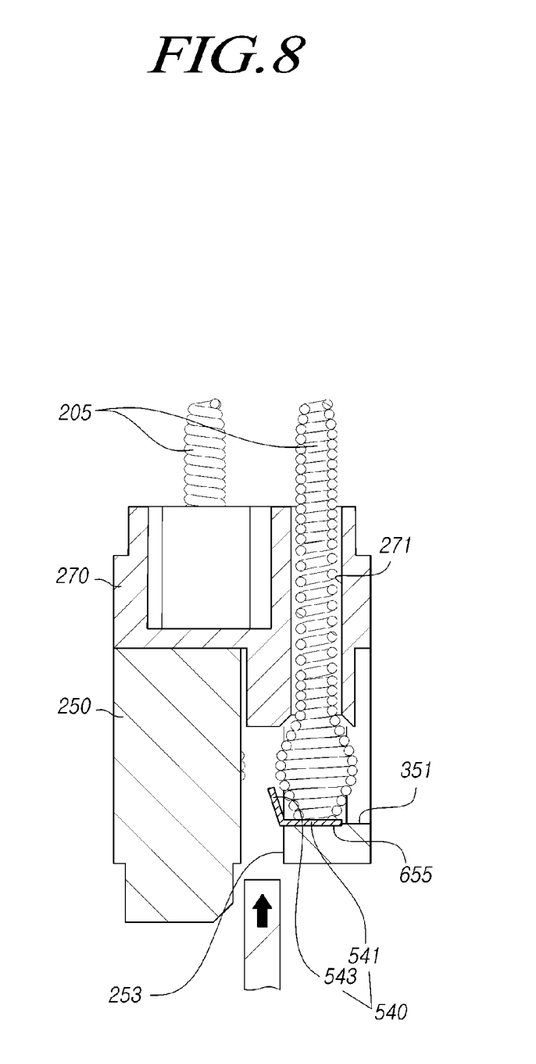

FIG. 2 is an exploded perspective view of a pressure sensor according to the present embodiments, FIG. 3 is a perspective view of a part of a pressure sensor according to the present embodiments, FIG. 4 is a sectional view of A of FIG. 3, FIG. 5 is an exploded perspective view of a pressure sensor according to the present embodiments, FIG. 6 is a sectional view of a part of a pressure sensor according to the present embodiments, and FIG. 7 and FIG. 8 are sectional view of a pressure sensor according to the present embodiments.

As shown in the drawings, a pressure sensor 200 according to the present embodiments includes: a sensor module 210 which senses pressure; a first supporter 230 which is coupled to an upper portion of the sensor module 210 and has a substrate 231 disposed therein, the substrate 231 being lengthily disposed in an axial direction, to be electrically connected to the sensor module 210; and a second supporter 250 to which the substrate 231 is coupled while being brought into contact with the spring electrode 205, the second supporter 250 being coupled to an upper portion of the first supporter 230 and having a spring groove 351 formed therein in which a lower end portions of the spring electrode 205 lengthily disposed in an axial direction is stably placed.

For example, the pressure sensor 200 is arranged in an electronic control type brake system, measures brake hydraulic pressure generated from a master cylinder (not shown), and controls the brake hydraulic pressure according to the measured value of the pressure sensor 200, thereby providing a stable braking force.

The sensor module 210 disposed at a lower portion of the pressure sensor 200 has a flow path 211 formed at a lower portion thereof to measure the brake hydraulic pressure, and the spring electrode 205 arranged at an upper portion of the pressure sensor 200 contacts an electronic control device provided in the electronic control type brake system to transmit an electric signal thereto.

In this regard, the substrate 231 is lengthily disposed in an axial direction between the sensor module 210 and the spring electrode 205 so that information measured by the sensor module 210 is transmitted to the substrate 231 through an electric wire 323. The substrate 231 contacts the spring electrode 205 to transmit an electric signal thereto.

The pressure sensor 200 includes: a sensor module 210 which senses pressure; a first supporter 230 which is coupled to an upper portion of the sensor module 210 and has a substrate 231 therein; and a second supporter 250 which is coupled to an upper portion of the first supporter 230 and has a spring electrode 205 therein.

In addition, a housing 201 surrounding the sensor module 210, the first supporter 230, and the second supporter 250 is provided to protect the sensor module 210, the first supporter 230, and the second supporter 250 from the external environment.

The sensor module 210 has a flow path 211 famed through a lower portion thereof to be connected with a flow path of a master cylinder side, and a hydraulic pressure of a brake oil introduced through the flow path 211 is sensed by a sensor 213.

A sensing element 317 is disposed at an upper portion of the sensor module 210 to measure a pressure of the sensor module 210 and the sensing element 317 and the substrate 231 are electrically connected to each other.

The first supporter 230 is coupled to an upper portion of the sensor module 210 and has a sensor protrusion 215 of the sensor module 210 and the substrate 231 arranged therein, wherein the sensor protrusion 213 and the substrate 231 are spaced apart from each other to prevent an impact from being transmitted to the substrate 231.

In addition, the substrate 231 is lengthily formed in an axial direction so that a lower portion thereof is electrically connected to the sensor protrusion 213 by the electric wire 323 while being spaced from the sensor protrusion 213, and an upper portion thereof is coupled to the second supporter 250 and contacts the spring electrode 205.

As the substrate 231 is lengthily formed in an axial direction, the pressure sensor 200 may be reduced in the overall size thereof and manufactured in a compact size, compared with a conventional substrate formed in a radial direction.

The substrate 231 is disposed to be spaced from the sensor module 210 and thus can prevent vibration and an impact from being transmitted thereto, and is electrically connected to the sensor module 210 via the sensing element 317.

In addition, the sensor module 210 has a sensor protrusion 215 protruding upward. The sensor protrusion 215 has an axially elongated flat surface portion 215a is in parallel to the substrate 231. A sensing element 317 is formed on the flat surface portion 215a.

At this time, the flat surface portion 215a is famed as a relatively thin surface at the sensor module 210 to allow a pressure applied to the sensor module 210 to be measured. The sensing element 317 is installed on the flat surface portion 215a to measure a pressure applied to the sensor module 210.

The sensing element 317 is disposed on the flat surface portion 215a which is lengthily disposed in an axial direction parallel to the substrate 231, so that the electric wire 323 may be easily installed on each of the sensing element 317 and the substrate 231, and thus the pressure sensor 200 may be manufactured in a compact size by efficiently utilizing the inner side space of the first supporter 230.

In addition, the first supporter 230 is coupled to an upper portion of the sensor module 210 while surrounding the sensor protrusion 215 to protect the sensing element 317 and the substrate 231 from the external environment.

A coupling surface 335 facing one side surface of the substrate 231 is famed at the first supporter 230 and the substrate 231 is lengthily disposed at the first supporter 230 in an axial direction while being coupled to the coupling surface 335. The substrate 231 is stably coupled to the inner side of the first supporter 230.

In addition, the first supporter 230 has step portions 237 protruding from opposite sides thereof to be stepped at the coupling surfaces 335 and cover the sensor protrusion 215 of the sensor module 210, whereby a lower end portion of the substrate 231 is supported by and coupled to the step portions 237.

In addition, a soldering portion 336 protruding from the coupling surface 335 and toward the substrate 230 is formed therebetween, whereby the substrate 231 and the coupling surface 335 may be coupled by soldering, thus the substrate 231 is stably coupled to the coupling surface 335.

Accordingly, one side surface of the substrate 231 and the coupling surface 335 are supported while an upper portion of the substrate 231 is coupled to the second supporter 250. Further, the first supporter 230 is coupled to the second supporter 250 while a lower portion of the substrate 231 is supported by the step portions 237, and the one side surface of the substrate 231 and the soldering portion 336 are soldered together.

In addition, the substrate 231 and the sensing element 317 are directly connected by the electric wire 323 installed therebetween, and the upper portion of the substrate 231 is brought into contact with the spring electrode 205 to be electrically connected thereto.

Accordingly, only the one substrate 231 lengthily disposed in an axial direction is directly connected with the sensing element 317 of the sensor module 210 via the electric wire 323 and is brought into contact with the spring electrode 205, thereby reducing material and process costs for the electrical connection, compared with the conventional art separately including an electronic equipment module, a contact substrate, and a spring electrically connecting the electronic equipment module and the contact substrate.

The second supporter 250 is coupled to the upper portion of the first supporter 230 and has a spring groove 351 famed therein, so that the spring electrode 205 lengthily disposed in an axial direction is disposed in the spring groove 351. The spring electrode 205 is inserted in the spring groove 351 to allow the lower end portion thereof to be stably placed in the spring groove 351 and protrudes upward to allow the upper end portion thereof to be in contact with the electronic control device.

The substrate 230 is coupled to a lower portion of second supporter 250 to be in contact with the spring electrode 205, and the substrate 231 coupled to the second supporter 250 is protrudingly coupled to one side of the spring groove 351 so as to be in contact with the spring electrode 205.

In addition, the spring electrode 205 has the lower end portion stably placed in the spring groove 351 and upper end portion protruding toward from the second supporter 250 to contact the electronic control device (not shown) and thereby transmit an electrical signal thereto, wherein a circumference of a lower side thereof stably placed in the spring groove 351 is formed larger than that of an upper protruding side thereof.

A third supporter 270 is coupled to the second supporter 250 such that the spring electrode 205 is stably placed in and fixed to the spring groove 351, wherein the third supporter 270 has a through-hole 271 through which the upper side of the spring electrode 205 passes.

At this time, the through-hole 271 is formed to be smaller than the spring groove 351 and thus only the upper side of the spring electrode 205 can pass therethrough. Further, the lower side of the electrode electrode 205 is supported between the spring groove 351 and the through-hole 271 of the third supporter 270 and thus the position of the spring electrode 205 is fixed.

Meanwhile, the second supporter 250 has an insertion groove 253 formed in a lower portion thereof for inserting the substrate 231 so that the substrate 231 is coupled to the second supporter 250 to be in contact with the spring electrode 205, wherein the insertion groove 253 communicates with the spring groove 351 and thus the substrate 231 inserted into the insertion groove 253 is protrudingly coupled to one side of the spring groove 351.

Accordingly, the substrate 231 is coupled to the insertion groove 253 and protrudes to the spring groove 351 and, more specifically, one side surface of the substrate 231 protrudes to two spring grooves and the other side surface of the substrate 231 protrudes to one spring groove so that the protruding portions contact the spring electrodes 205.

The substrate 231 has a protrusion 232 steppedly protruding from an upper portion thereof and the protrusion 232 is inserted into the insertion groove 253, and the lower portion of the second supporter 250 is coupled and supported by the upper portion of the substrate 231.

In addition, the substrate 231 presses an outer circumferential surface of the spring electrode 205 while being inserted into the insertion groove 253 so as to be inserted and coupled to the insertion groove 253, and the outer circumferential surface of the spring electrode 205 which has been pressed by the substrate 231 is brought into contact with and electrically connected to the substrate 231.

The spring electrode 205 includes, at a portion thereof contacting the substrate 231, a diameter-increased portion convexly formed by increasing the outer diameter of the spring electrode 205. Therefore, when the substrate 231 is inserted, the diameter-increased portion 205a is pressed in the radial direction and the spring electrode 205 is brought into tight contact with the substrate 231.

In addition, contact grooves 233 are formed on both side surfaces of the substrate 231 so that the diameter-increased portions 205a of the spring electrodes 205 are stably brought into tight contact therewith, wherein the contact grooves 233 are formed at protruding portions of the both side surfaces of the substrate 231, protruding to the spring grooves 351.

In addition, each of the contact grooves 233 is famed to be recessed in a round shape so that the diameter-increased portion 205a of the spring electrode 205 can be stably placed in and be in contact with each of the contact grooves 233.

An electrode member 540 may be additionally provided so that the substrate 231 and the spring electrode 205 can stably maintain a contact therebetween without being separated from each other. Referring to FIGS. 5 to 8, a pressure sensor 500 according to embodiments in which an electrode member 540 is additionally provided will be described later.

The pressure sensor 500 according to these embodiments includes a sensor module 210, a first supporter 230, a second supporter 250, a third supporter 270, and a housing 201, and has the same structure as that of the pressure sensor 200 according to one embodiment described above, so a detailed description thereof will be omitted.

Referring first to FIGS. 5 and 6, the electrode member 540 includes: a spring contact portion 541 that is famed a bent plate shape, is stably placed in the spring groove 351, and is brought into contact with the spring electrode 205; and a substrate contact portion 543 that is stably placed in the insertion groove 253 and is brought into contact with the substrate 231, wherein the spring contact portion 541 and the substrate contact portion 543 are formed to be bent.

In the present embodiments, the electrode member 540 is, for example, disposed in each of three spring grooves 351 so as to electrically connect a lower end portion of the spring electrode 205 and the substrate 231.

The spring electrode 205 is electrically connected to the substrate 231 when the substrate 231 is inserted into the insertion groove 253 while pressing the outer circumferential surface of the spring electrode 205. Further, the lower end of the spring electrode 205 is electrically connected to the substrate 231 via the electrode member 540. Consequently, the spring electrode 205 and the substrate 231 have a double contact structure.

Accordingly, the double contact structure connecting the spring electrode 205 and the substrate 231 prevents contact failure and stably maintains electrical connection therebetween even when the spring electrode 205 and the substrate 231 are spaced from each other or the spring electrode 205 and the spring groove 351 are spaced from each other, The spring contact portion 541 is disposed between the spring grove 351 and the spring electrode 205 and is formed in a round shape to correspond to the spring groove 351 so that the spring contact portion 541 has a widened area contacting the electrode 205.

In addition, a first seating groove 655 is formed to be recessed downward on the surface of the spring groove 351 on which the spring electrode 205 is stably placed so that the spring contact portion 541 can be coupled and fixed to the first seating groove 655.

At this time, the first seating groove 655 is formed in a shape corresponding to the spring contact portion 541.

In addition, the first supporter 230 and the second supporter 250 are coupled while pressing the spring electrode 205 so that the spring electrode 205 supports the spring groove 351 in an axial direction, and the spring contact portion 541 is disposed between the spring groove 351 and the spring electrode 205 by a supporting force of the spring electrode 205

The substrate contact portion 543 is disposed between the insertion groove 253 and the substrate 231 and the insertion groove 253 includes a second seating groove 657 famed thereon to which the substrate contact portion 543 is coupled so that the substrate 543 is stably placed in the second seating groove 657.

In addition, when the substrate 231 is inserted into the insertion groove 253, the substrate 231 is coupled to the substrate contact portion 543 while pressing the substrate contact portion 543. Therefore, the substrate contact portion 543 maintains the state of supporting the substrate 231.

Next, referring to FIG. 7, the substrate contact portion 543 may be provided with an elastic deforming portion 543a protruding to the outside of the insertion groove 253. Therefore, when the substrate 231 is inserted into the insertion groove 253, the elastic defaming portion 543a is elastically deformed by the substrate 231 and can be in tight contact with and supported by the insertion groove 253 and both sides of the substrate 231.

Further, the substrate contact portion 543 may be provided with a support end portion 543b that extends from the end of the elastic deforming portion 543a, is bent therefrom, and is supported by an outer side surface of the second supporter 250. When the substrate 231 is inserted into the insertion groove 253, the substrate contact portion 543 can be correctly positioned and assembled without being pushed in the inserting direction due to the support end portion 543b.

Also, referring to FIG. 8, the substrate 543 of the electrode member 540 may be bent in a direction opposite to those of FIGS. 5 to 7.

In this case, the substrate contact portion 543 is bent in a direction to surround the outer circumferential surface of the spring electrode 205 from the spring contact portion 541, and when the substrate 231 is inserted, the substrate contact portion 543 is elastically defamed and can be in tight contact with and supported by the substrate 231.

Accordingly, the substrate contact portion 543 has a structure applying a force of widening the substrate contact portion 543 to support the substrate 231, so as to stably maintain the state in which the substrate contact portion 543 ad the substrated 231 is in contact with each other.

According to the present embodiments having such a shape and structure, since the substrate is disposed in the axial direction, the pressure sensor can be manufactured in compact size by reducing the size of the substrate. Further, only one substrate is provided and is directly connected to the connector of the terminal portion via the electric wire, and thus material and process costs for the electrical connection can be reduced.

Further, the substrate is brought into contact with the outer circumferential surface of the spring electrode so that the electrical connection is stable. In addition, the electrode member is additionally provided so that the substrate and the spring electrode are connected in the double contact structure. Therefore, the contact failure and the malfunction can be prevented.

Although all the elements constituting embodiments of the present disclosure have been described above as being combined into a single unit or combined to be operated as a single unit, the present disclosure is not necessarily limited to such embodiments. That is, at least two elements of all structural elements may be selectively joined and operate without departing from the scope of the present disclosure.

The above embodiments have been described merely for the purpose of illustrating the technical idea of the present disclosure, and those skilled in the art will appreciate that various modifications and changes are possible without departing from the scope and spirit of the present disclosure. Therefore, the embodiments disclosed in the present disclosure are intended to illustrate the scope of the technical idea of the present disclosure, and the scope of the present disclosure is not limited by the embodiment The scope of the present disclosure shall be construed on the basis of the accompanying claims in such a manner that all of the technical ideas included within the scope equivalent to the claims belong to the present disclosure.

What is claimed is:

1. A pressure sensor comprising:
a sensor module configured to sense pressure;
a first supporter coupled to an upper portion of the sensor module and having a substrate disposed therein, the substrate being lengthily disposed in an axial direction to be electrically connected to the sensor module; and
a second supporter to which the substrate is couple while being brought into contact with a spring electrode, the second supporter being coupled to an upper portion of the first supporter and having a spring groove formed therein such that a lower end portion of the spring electrode lengthily disposed in an axial direction is stably placed in the spring groove.

2. The pressure sensor of claim 1, wherein the substrate is coupled to the second supporter while pressing an outer circumferential surface of the spring electrode and is brought into contact with the outer circumferential surface of the spring electrode to be electrically connected thereto.

3. The pressure sensor of claim 2, wherein the spring electrode comprises a diameter-increased portion convexly formed at a portion thereof contacting the substrate by increasing the outer diameter of the spring electrode.

4. The pressure sensor of claim 3, wherein contact grooves are formed to be recessed in a round shape on both side surfaces of the substrate, and the diameter-increased portion of the spring electrode is brought into tight contact with the contact grooves.

5. The pressure sensor of claim 1, wherein the second supporter has an insertion groove formed on a lower portion thereof so that an upper portion of the substrate is inserted and coupled therein, and the insertion groove communicates with the spring groove.

6. The pressure sensor of claim 1, wherein a coupling surface facing the one side surface of the substrate is formed at the first supporter and the substrate is lengthily disposed at the first supporter in an axial direction while being coupled to the coupling surface.

7. The pressure sensor of claim 1, wherein the sensor module comprises a sensor protrusion protruding upward and having a long flat surface portion formed in an axial direction so as to be parallel to the substrate, and a sensing element is disposed on the flat surface portion to measure a pressure of the sensor module.

8. The pressure sensor of claim 7, wherein the substrate is connected to the sensing element by an electric wire.

9. The pressure sensor of claim 1, further comprising an electrode member comprising: a spring contact portion which is stably placed in the spring groove and is in contact with the spring electrode; and a substrate contact portion which is bent from the spring contact portion, is stably placed in the insertion groove, and is brought into contact with the substrate, so that the electrode member electrically connects the spring electrode and the substrate.

10. The pressure sensor of claim 9, wherein the substrate contact portion comprises an elastic deforming portion, which convexly protrudes to the outside of the insertion groove and is thus in tight contact with and supported by the insertion groove when the substrate is inserted into the insertion groove.

11. The pressure sensor of claim 10, wherein the substrate contact portion comprises a support end portion, which extends and is bent from the end of the elastic deforming portion and is supported on an outer side surface of the second supporter.

12. The pressure sensor of claim 9, wherein a first seating groove, to which the spring contact portion is coupled, is formed in the spring groove.

13. The pressure sensor of claim 9, wherein a second seating groove, to which the substrate contact portion is coupled, is formed in the insertion groove.

14. The pressure sensor of claim 1, further comprising an electrode member, which is configured to electrically connect the spring electrode and the substrate, wherein the electrode member comprises: a spring contact portion, which is stably placed in the spring groove and is brought into contact with the spring electrode; and a substrate contact portion, which is bent in a direction surrounding an outer circumferential surface of the spring electrode from the spring contact portion and is in tight contact with the substrate while being elastically deformed when the substrate is inserted therein.

15. The pressure sensor of claim 1, wherein the substrate of the first supporter is a single substrate being lengthily disposed in the axial direction of the pressure sensor to be electrically connected to the sensor module.

* * * * *